United States Patent
Schatz et al.

(10) Patent No.: US 6,316,754 B1
(45) Date of Patent: Nov. 13, 2001

(54) FREQUENCY SELECTED, VARIABLE OUTPUT INDUCTOR HEATER SYSTEM

(75) Inventors: Douglas S. Schatz; John M. Dorrenbacher, both of Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 0 days.

(21) Appl. No.: 09/462,402

(22) PCT Filed: Jul. 8, 1998

(86) PCT No.: PCT/US98/14125

§ 371 Date: Apr. 28, 2000

§ 102(e) Date: Apr. 28, 2000

(87) PCT Pub. No.: WO99/03308

PCT Pub. Date: Jan. 21, 1999

Related U.S. Application Data

(60) Provisional application No. 60/052,029, filed on Jul. 9, 1997.

(51) Int. Cl.⁷ .................................. H05B 6/44; H05B 6/06
(52) U.S. Cl. .......................... 219/656; 219/662; 219/674; 219/638
(58) Field of Search ..................... 219/656, 655, 219/662, 671, 666, 674, 672, 635, 638; 148/567, 572; 266/129

(56) References Cited

U.S. PATENT DOCUMENTS

| | | | |
|---|---|---|---|
| 2,669,647 | 2/1954 | Segsworth | 219/10.71 |
| 4,093,839 | 6/1978 | Moliterno et al. | 219/8.5 |
| 4,506,131 | 3/1985 | Boehm et al. | 219/10.77 |
| 4,755,648 | 7/1988 | Sawa | 219/10.77 |
| 4,788,394 | 11/1988 | Vanneste et al. | 219/10.61 R |

*Primary Examiner*—Philip H. Leung
(74) *Attorney, Agent, or Firm*—Santangelo Law Offices, P.C.

(57) ABSTRACT

An induction heating systems using a plurality of zones in a coil provides selective heating control for better uniformity especially for semiconductor and other thin film processing applications. By arranging the zones to have different resonance frequencies, the power supply may control the various zones by altering its frequency output. The power supply may also act to control the differential heating by switching among zones in conjunction with the frequency control, by sweeping through a variety of frequencies, by simultaneously providing power over different frequencies, by altering the residence time at each frequency, or by outputting different powers to each frequency or the like. Each zone may thus be tuned as appropriate to achieve the desired induction heating characteristic.

48 Claims, 3 Drawing Sheets

FREQUENCY SELECTED, VARIABLE OUTPUT INDUCTOR HEATER SYSTEM

This application is a National Phase Application filing under 35 U.S.C. 371 of International Patent Application, Ser. No. PCT/US98/14125, filed Jul. 8, 1998, which is a continuation-in-part of U.S. patent application Ser. No. 60/052,029, filed Jul. 9, 1997, and claims the benefit thereof each hereby incorporated by reference.

TECHNICAL FIELD

This invention relates to heating systems using high frequency energy to induce currents in objects to heat them directly or indirectly ("induction heating systems"). In particular it relates to heating systems for semiconductor processing equipment in which layers are formed on heated semiconductor wafers by Chemical Vapor Deposition.

Equipment for the formation of layers, such as epitaxial silicon or polysilicon, on semiconductor wafers is well known. One of the problems in forming layers of materials on a semiconductor wafer is ensuring that the temperature of the semiconductor wafer is kept uniform across the wafer during the deposition process, i.e., during heat-up, processing, and cool-down. Since the deposition rate of a layer of material upon the wafer is dependent on the temperature of the wafer, any temperature variations between the center and edge of a wafer will undesirably result in the deposition of a layer of non-uniform thickness on the wafer. In addition, non-uniform temperatures during heat-up, processing, and cool-down can cause stress on the wafer, undesirably resulting in slip. Accordingly, it is important during the deposition of a layer of material on a silicon wafer to minimize temperature variations across the surface of the wafer.

Some earlier systems developed to achieve temperature uniformity across a wafer teach applying heat in a uniform manner across all portions of a wafer. However, since heat loss is typically greater at the edge of a wafer than at the center, such earlier systems may result in significant temperature differences between the center and outer portions of the wafer and, thus, may be largely ineffective in minimizing temperature gradient across the surface of a wafer.

Some more recent heating schemes employ lamp assemblies having heating lamps arranged in a plurality of independently controlled zones to allow differing amounts of heat to be applied to the outer and center portions of the wafer. In this manner, variations of heat loss on a wafer can be compensated by applying differing amounts of heat to various portions of the wafer in order to achieve greater temperature uniformity across the wafer. Such techniques are typically able to maintain temperature differences of less than 10° C. across the wafer.

The heating lamps employed in such multiple-zone heating assemblies may result in several disadvantages. Each of these lamps, which is typically of the tungsten halogen type, has a finite useful life and thus must be periodically replaced. The replacement of such lamps, as well as the periodic adjustment of the lamps due to their aging, not only increases manufacturing cost but also decreases the throughput of the chemical vapor deposition (CVD) system.

Furthermore, the use of such heating lamps in a radiantly heated CVD system undesirably requires periodically cleaning of the quartz walls of the reaction chamber to remove deposited material from the chamber walls. Recall that since the walls in a lamp heated CVD reaction chamber become heated, layers of material deposit not only on the wafer but also on the chamber walls. The resulting film formed on the chamber walls then absorbs some of the radiant energy emitted from the heating lamps and thereby locally increases the temperature of the chamber walls. As a result, layers of material deposit on the chamber walls at an ever increasing rate, creating a "snowball" effect. It is therefore critical, in a lamp heated CVD chamber, that the walls be kept meticulously clean. This requires that the walls be etched frequently, in some cases after every run. Cleaning the walls typically takes between two and four minutes after depositing an epitaxial layer, and longer after depositing a polysilicon layer. Since the entire cycle in warm wall CVD systems may be between five and ten minutes, cleaning the walls accounts for a significant portion of the total cycle time and, therefore, can severely reduce throughput of the CVD system.

DISCLOSURE OF INVENTION

Accordingly, it is desirable to provide a heating system for chemical vapor deposition systems which uniformly and precisely heats a semiconductor wafer without the above mentioned deficiencies.

It is an object of the present invention, therefore, to permit control of the power delivered to each of a plurality of zones of an object to be heated by an induction heating system.

It is a further object of the invention to allow delicate and precise control over the temperature profile of an object being heated by an induction heating system.

It is another object of the invention to permit rapid temperature changes in an object being heated by an induction heating system while simultaneously maintaining the temperatures of a plurality of zones of said object in exact proportion to one another.

It is yet a further object of the invention to permit rapid temperature changes in an object being heated by an induction heating system while simultaneously holding the temperatures of a plurality of zones of said object precisely equal.

It is a further object of the present invention to maintain the temperatures of a plurality of zones of said object in exact proportion to one another as the object is cooled from a heated state.

It is another object of the invention to permit rapid cooling of an object in an induction heating system while simultaneously maintaining the temperatures of a plurality of zones of said object in exact proportion to one another.

It is yet another object of the present invention to eliminate the need for high current switches in a multi-zone induction heating system.

It is another object of the invention to permit the use of a single power supply in a multi-zone induction heating system.

It is a further object of the invention to eliminate or greatly reduce the interaction between zones of a multi-zone induction heating system.

It is yet a further object of the invention to obtain high power supply utilization in a multi-zone induction heating system.

It is still a further object of the present invention to permit rapid heating of a semiconductor wafer or other single crystal object without "slip", or dislocation of the crystal lattice.

Accordingly, one embodiment of the present invention is directed to a system for producing heating in an object such that precise control is possible of the energy deposited in a plurality of zones of the object to be heated through precise control of the power delivered to sections of a nearby induction coil which induces circulating currents in either the object to be heated or a susceptor placed in close proximity to the object to be heated.

One embodiment accomplishes these objects by utilizing an induction coil split into sections (a "tapped" induction coil), and selecting resonating capacitors for each section such that the frequency of resonance is different for each section. A frequency agile power supply is connected to the coil and the frequency of the output of the power supply is switched from the resonance frequency for the first section to the resonance frequency of the second section, to the resonant frequency of the third section, and so on until power has been applied to all (or all desired) sections.

MODE(S) FOR CARRYING OUT THE INVENTION

Figure 1:
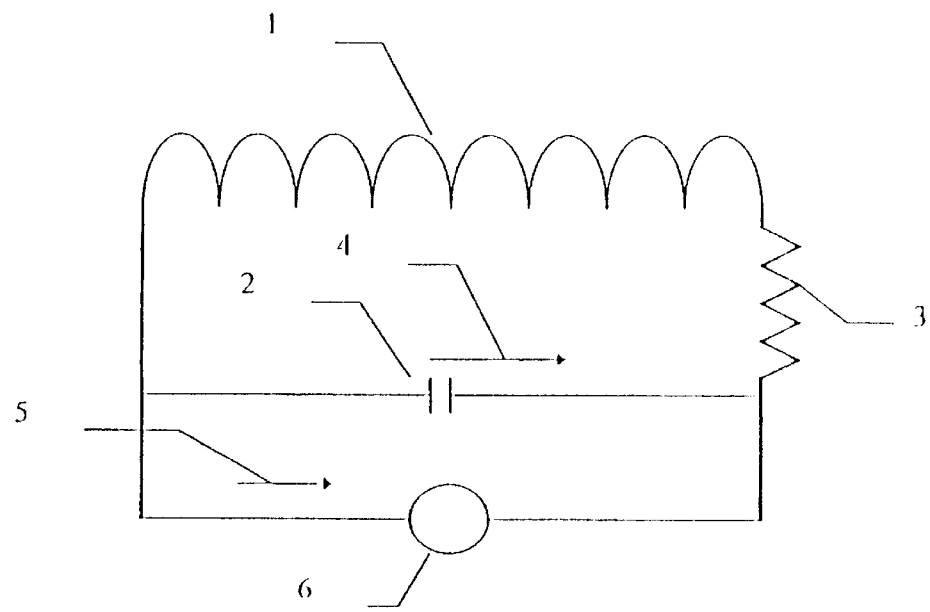
FIG. 1 shows circulating current in a resonant circuit.

In general, an induction heating system is comprised of a power supply, an induction coil, an object to be heated and, if necessary, a "susceptor" to absorb energy from the magnetic field of the coil and retransmit that energy to the object to be heated. The system operates on the principle of induction of circulating currents in the object to be heated or the susceptor, if present. Generally a susceptor is used if the object to be heated is not adequately conductive (and thus cannot support the induced heating currents) or would be damaged in some way by such currents. The currents required to obtain substantial heating in large objects or rapid heating of small objects are large. A coil carrying large currents creates a large magnetic field in its vicinity, and energy is stored in this field. While much of the field may be canceled by the induced current in the susceptor or object to be heated, there remains enough to store appreciable energy. This energy is represented electrically as inductance, and to create large currents in an inductor requires high voltages. The presence of high voltage and high current requires a great deal of power from the supply unless the energy represented by the magnetic field is stored elsewhere in the system when the current collapses on each cycle of the current. If an electrical capacitance is placed in series or parallel with the coil, and the frequency of the alternating current is properly chosen, energy can be stored in the capacitance, and the power supply can be made much smaller than would be required without the capacitor. Thus it is typical for an induction heating system to be arranged so that the coil is "resonated" with a capacitor. That is, a capacitor is placed in series or parallel with a value such that the electrical circuit is resonant at the operating frequency of the power supply. Such an arrangement is shown in FIG. 1. Here coil 1 has a capacitor 2 connected in parallel with it. Resistor 3 represents the equivalent resistor resulting from the energy loss in the heated body or susceptor and the coil and capacitor. Energy is stored alternatively in the coil and the capacitor, with the energy exchanging between the two twice every cycle of the alternating output of the power supply. This system permits the power supply to deliver only the losses of the resonant circuit, which are principally the energy lost in the object to be heated (or the susceptor, if present) and the coil itself, which is heated by the current flowing through it. Representing the "quality factor", or "Q", by $$Q = \frac{\omega L}{R},$$

where L is the inductance of the coil 1, R is the equivalent resistor 3, and ω is the angular frequency, equal to 2 times pi times the frequency in Hz, the current 4 is Q times higher than the current 5, provided a resonant condition is established, by selecting the capacitance value C of the capacitor 2 in accordance with the formula $$\omega = \frac{1}{\sqrt{LC}}$$

Typically the Q is about 10 for an induction heating system, and so the power supply need deliver only 1/10 of the circulating current. Said conversely, one can obtain coil currents easily 10 times the power supply current by this method. This "resonant" system is well known and has been used successfully for many years in induction heating applications, including semiconductor processing systems.

In the present situation, it is desired to heat multiple areas of a susceptor in such a way as to produce a high degree of temperature uniformity. To this end, a multiple coil is employed, i.e., a coil with electrical taps so that the currents in various portions of it can be made different. The different currents in the different sections of the coil may then induce different currents in physical zones of the susceptor or object to be heated, giving one the ability to deposit energy into those zones selectively and in precise amounts. A problem arises when such a system is made resonant, however, because of the mutual coupling of the various portions of the coil.

When a current is induced in one section of a multiple section coil, a magnetic field is created by the current. The lines of this magnetic field will intercept the object to be heated and the susceptor if present, producing the desired circulating currents and resultant desired heating in the physical zone of the object to be heated or the susceptor associated with that section of the multiple section coil. These lines will also intersect the other portions of the coil, however, inducing currents in those other coil segments, and this will in turn create heating in unwanted physical zones of the object to be heated or the susceptor, if present. Because not all of the magnetic field lines intersect the other portions of the coil, the heating will be greatest in the desired zone (i.e., the zone associated with the driven portion of the coil), but the undesired heating in the other zones interferes with one's ability to control the temperature distribution precisely. As the object to be heated or the susceptor is moved further from the coil, the interaction between the various segments of the coil will increase and the ability to control the energy deposited in the various zones will deteriorate.

Figure 2:
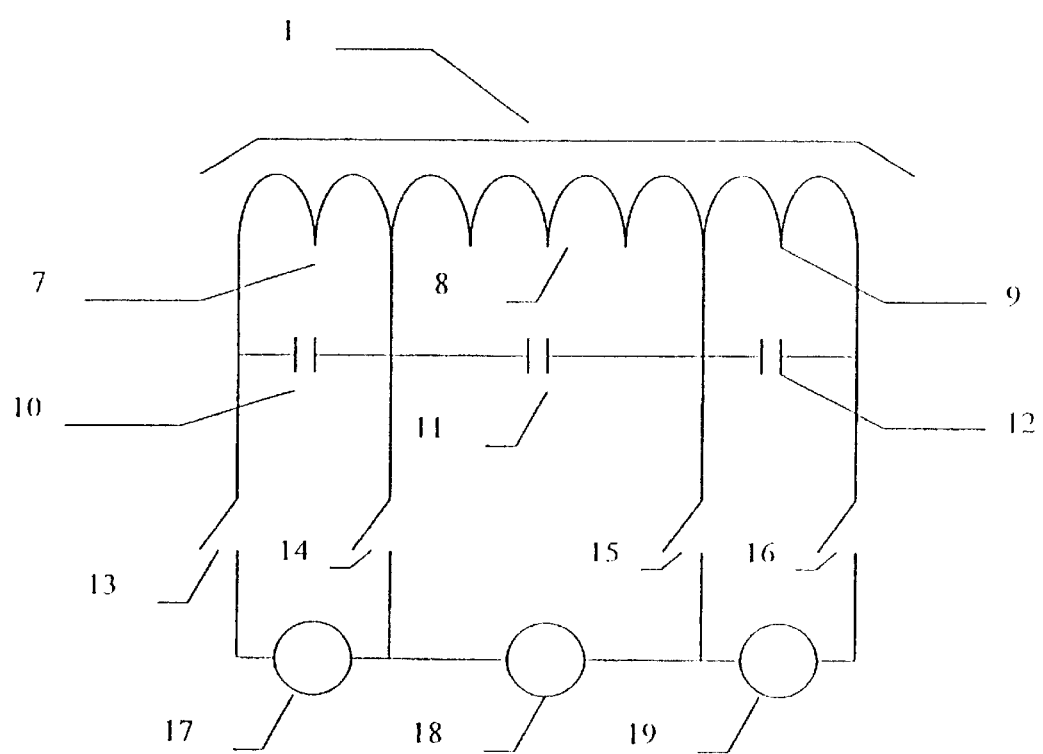
FIG. 2 shows a system involving switched power to a tapped coil.
Figure 3:
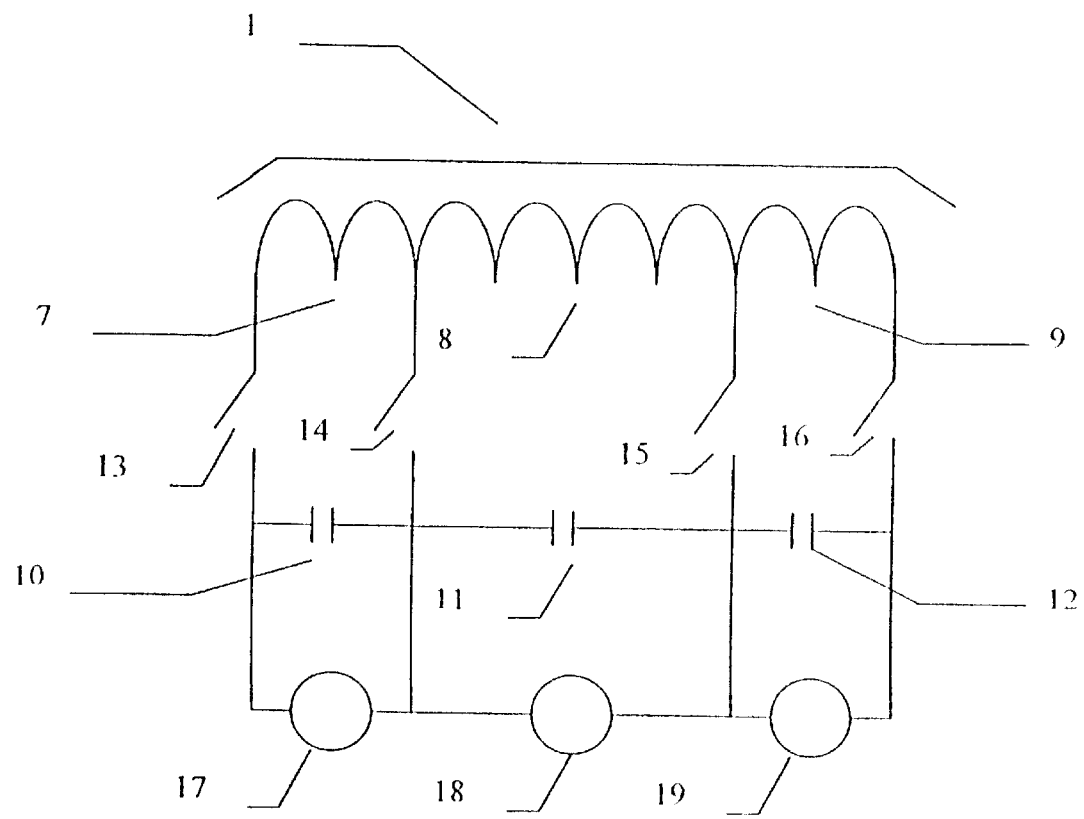
FIG. 3 shows an alternative arrangement for a system involving switched power to a tapped coil.

It might be practical to use electronic switches to switch a power supply from one tap of the coil to another to force the power supply current to flow only through the desired segment of the coil. In FIG. 2 is shown a tapped coil with resonating capacitors and power supplies 17, 18 and 19 with switches. Assume switches 13 and 14 are closed, connecting power supply 17 to coil section 7 of coil 1. Even if switches 15 and 16 are open circuited, mutual coupling between coil sections 7 and 8 and also between coil sections 7 and 9, caused by the magnetic field lines of coil section 7 cutting through the turns of coil sections 8 and 9 may create circulating Currents in the coupled coil sections 8 and 9. These currents can flow because of the capacitors 11 and 12 across those coil sections 8 and 9, which form a resonant loop with their respective coil section. While it is possible to move the switch locations to break the circulating currents induced in the undriven coil sections as shown in FIG. 3, this means that the switches might now carry the full value of the circulating currents, which can be thousands of amperes due to the multiplying effect of the resonance as described above. Also, for practical reasons the capacitors may need to be located very close to the coil, to lower the inductance of the leads between the capacitors and the coils. If this is not done the large currents may cause high voltages to appear across the capacitors and losses to appear in local conducting surfaces due to the high magnetic fields surrounding the connecting leads. This may leave no space to mount the switching devices, even if such robust switches could be found.

In instances in which the circuit of FIG. 2 provides inadequate isolation of the sections and therefore inadequate control of the energy deposition in the object to be heated or the susceptor if present, and the circuit of FIG. 3 requiring an impractical selection and location of semiconductor switches, an alternative approach may be needed. In this situation, what may be needed is a method of depositing energy selectively into separate sections of an induction heating coil, which method permits delicate control over the amounts of energy deposited into each section, while permitting rapid switching between the various sections of the coil, to permit overall delicate and precise control of the temperature of the object to be heated.

It is also possible to permit the deposition of precise amounts of energy into zones of a wafer using a multizone induction coil and "spot" temperature monitoring system. The multiple zone coil may involve several sections which must be separately powered to effect the transfer of precise amounts of energy to the various parts of the susceptor which in turn heats the wafer. The separate powering of these coil segments may, however, require a novel approach to power supply design for reasons discussed herein.

Figure 4:
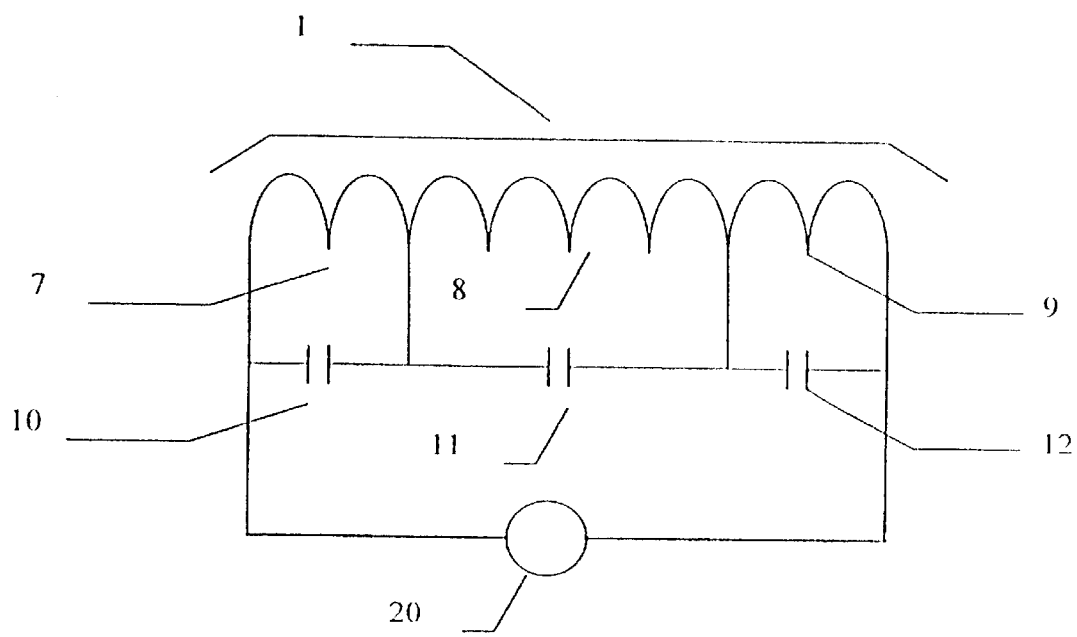
FIG. 4 shows a frequency agile power supply system.

In one embodiment, shown in FIG. 4, coil 1 is segmented into sections 7, 8, and 9, by taps. Capacitors 10, 11, and 12, are placed in parallel with coil sections 7, 8, and 9 respectively, and a frequency agile power supply 20 is placed in parallel with the entire coil 1. The capacitor values of the capacitors 10, 11, and 12 are chosen so that they are resonant with coil sections 7, 8, and 9 at frequencies $f_1$, $f_2$, and $f_3$, respectively. That is, the capacitance of capacitor 10 is chosen in accordance with the formula $$\omega_1 = 2\pi f_1 = \frac{1}{\sqrt{L_7 C_{10}}},$$

where $L_7$ is the inductance of coil section 7 and $C_{10}$ is the capacitance of capacitor 10.

Capacitance values for capacitors 11 and 12 are chosen similarly so that coil section 8 and capacitor 11 are resonant at a frequency $f_2$, preferably different from $f_1$, and so that coil section 9 and capacitor 12 are resonant at a frequency $f_3$ preferably different from $f_1$, and $f_2$. Of course, more taps may be provided on the coil and or less more sections of said coil created thereby, and possibly each of these sections would be resonant at a different frequency.

With each of the sections of the coil 1 resonant at a different frequency, it is possible then to select the frequency of the power supply 20 at frequencies $f_1$, $f_2$, $f_3$, to excite currents in coil sections 7, 8, and 9 respectively. If the control system is so arranged it may be that the frequency of the power supply is cycled from $f_1$, to $f_2$ to $f_3$ and back to $f_1$ in an continuous manner. Thus each coil segment is excited in turn, and energy selectively deposited in turn into the corresponding zones of the susceptor or object to be heated.

There are at least several methods available in such an arrangement to control the power delivered to each of the zones relative to the rest. In one embodiment, the time the power supply rests at each frequency may be varied to determine the energy deposited in each zone on each cycle. In another embodiment, the power delivered by the power supply during the period the supply is resting at each frequency may be varied while the time during which the supply rests at any given frequency may be held constant. In yet another embodiment, the frequency of the power supply may be deviated from exact resonance to affect the circulating current in the resonant elements, while the power and the time for each zone is held constant. It will be obvious that such control methods may be combined, with the resting time of each step of a cycle, the power delivered during each step of the cycle, and the exact frequency generated at each step of a cycle all being varied as appropriate to obtain the desired energy (and therefore temperature) profile.

It will be recognized by those skilled in the art that it may be desirable to maintain the frequency at each step such that the voltage and current of the power supply are nearly in phase with one another to prevent the necessity of delivering excess voltage or current from the power supply for a given amount of power. To the extent this is desirable in a given case the ability to control power by adjusting the frequency may be limited, and adjustment of the timing or power level of each step may be required to obtain the desired temperature or energy profile.

It is also possible to combine the approaches of FIG. 2 and FIG. 4. It will be recognized by those skilled in the art that there is a limit to the number of discrete frequency bands into which the frequency range of power supply 20 may be divided. This limit is established by the fact that the energy from the power supply is delivered to a resonant section of a small range of frequencies determined by the circuit "Q" as described above. As it is not possible or desirable to establish a circuit "Q" much higher than 10 or 20, and a section with a circuit "Q" of 10 will absorb energy in a band of frequencies roughly bounded by $(1-1/Q)f_r < f < (1+1/Q)f_r$, where $f_r$ is the resonant frequency of the section of the coil and its corresponding capacitor. Thus it may be necessary to separate the resonant frequencies of each of the coil sections by enough to prevent unwanted excitation of other sections with a resonant frequency adjacent to the driven section.

Figure 5:
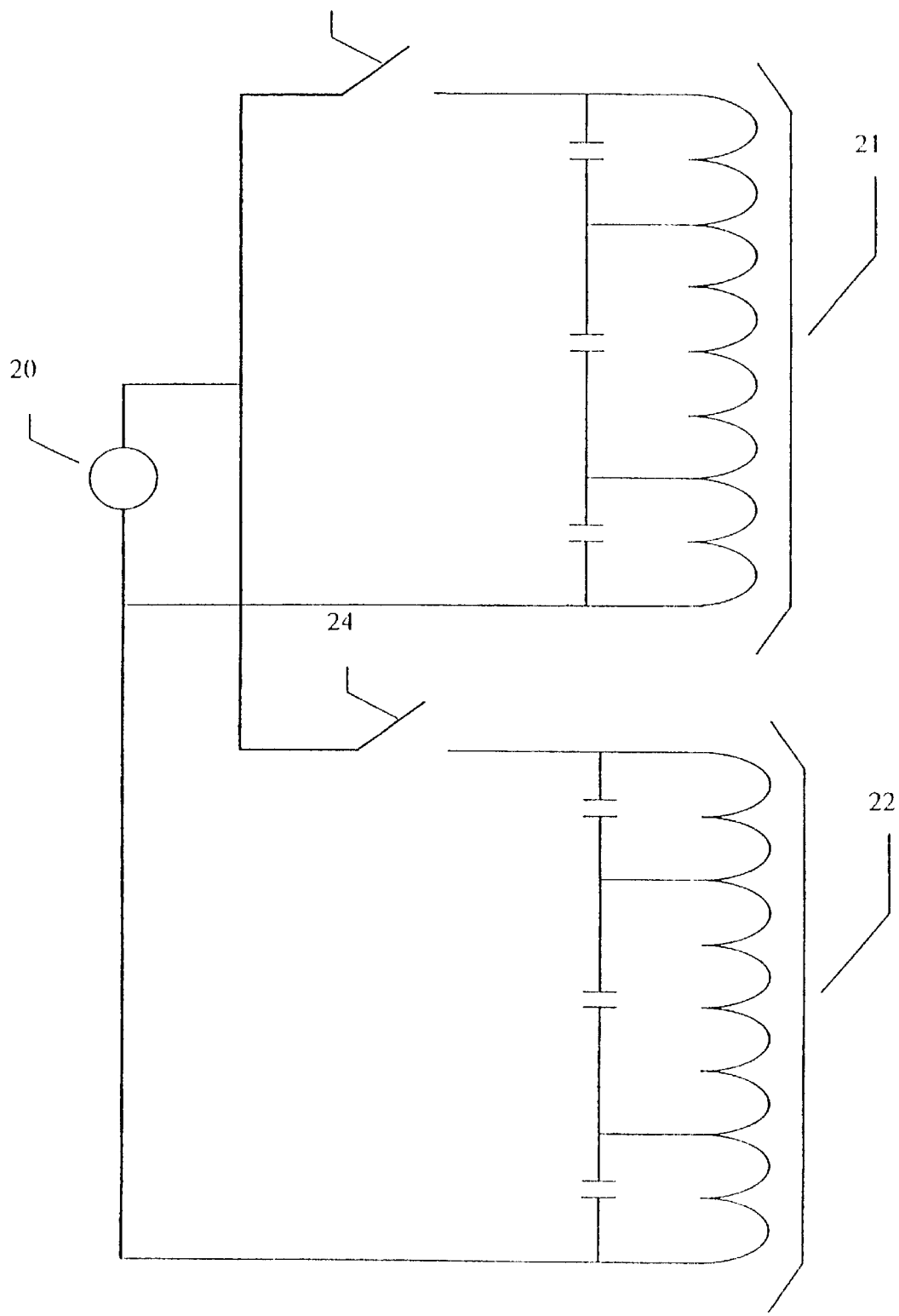
FIG. 5 shows a system with a multiple tapped coil configuration with switches.

Should the number of zones be large and the frequency range of the power supply 20 be inadequate to cover all of the zones, it is possible to combine the approaches indicated by FIGS. 2 and 4. That is, as shown in FIG. 5, it is possible to arrange two (or more) coils 21 and 22, each tapped in the manner of FIG. 2 or 4, but separated by switches 23 and 24 from power supply 20 so that the power supply 20 is connected to only one of the coils 21 or 22 at a time. This arrangement permits the use of a single frequency agile power supply with limited frequency range to control a plurality of zones with a high degree of precision.

We claim:
1. A multizone induction heating system comprising:
   a. a coil system divided into a plurality of zones, at least two of said zones having an electrical resonance frequency, said resonance frequencies having at least two different values;
   b. a power supply having an output frequency; and
   c. a control system to control the power delivered to each of said zones comprising a control circuit to change said output frequency of said power supply.

2. A multizone induction heating system as described in claim 1 wherein said coil system comprises a plurality of coils.

3. A multizone induction heating system as described in claim 1 wherein said coil system comprises at least one coil divided into a plurality of sections.

4. A multizone induction heating system as described in claim 1 wherein said control system further comprises a circuit to switch said output frequency among at least two operating frequencies.

5. A multizone induction heating system as described in claim 4 wherein said control system further comprises a circuit to vary the output power of said power supply while said output frequency is switched among said operating frequencies.

6. A multizone induction heating system as described in claim 4 wherein said control system further comprises a circuit to vary the residence times at each of said operating frequencies of said power supply.

7. A multizone induction heating system as described in claim 1 wherein said control system further comprises a circuit to vary said output frequency continuously over a range of frequencies.

8. A multizone induction heating system comprising:
   a. a coil system divided into a plurality of zones, at least two of said zones having an electrical resonance frequency, said resonance frequencies having at least two different values;
   b. a power supply having at least two simultaneously emitted output frequencies;
   c. a control system to control the power delivered to each of said zones wherein said at least two output frequencies are established to cause differentiated amounts of inductive heating by said zones.

9. A multizone induction heating system as described in claim 8 wherein said coil system comprises a plurality of coils.

10. A multizone induction heating system as described in claim 8 wherein said coil system comprises at least one coil divided into a plurality of sections.

11. A multizone induction heating system as described in claim 8 wherein at least one of said simultaneously emitted output frequencies operates at about the resonance frequency of one of said plurality of zones of said coil system.

12. A multizone induction heating system as described in claim 11 wherein at least one of said simultaneously emitted output frequencies operates at other than a resonance frequency of one any of said zones.

13. A multizone induction heating system as described in claim 12 wherein said control system to control the power delivered to each of said zones further compirses variable tuning circuitry configured to alter the amount of inductive heating caused by at least one of said zones.

14. A multizone induction heating system as described in claim 13 wherein said variable tuning circuitry comprises multiple frequency circuitry.

15. A multizone induction heating system as described in claim 13 wherein said variable tuning circuitry comprises resonance frequency variation circuitry.

16. A multizone induction heating system as described in claim 15 wherein said resonance frequency variation circuitry comprises at least one variable impedance element.

17. A multizone induction heating system as described in claim 11 wherein said control system to control the power delivered to each of said zones further comprises variable tuning circuitry configured to alter the amount of inductive heating caused by at least one of said zones.

18. A multizone induction heating system as described in claim 17 wherein said variable tuning circuitry comprises multiple frequency circuitry.

19. A multizone induction heating system as described in claim 17 wherein said variable tuning circuitry comprises resonance frequency variation circuitry.

20. A multizone induction heating system as described in claim 19 wherein said resonance frequency variation circuitry comprises at least one variable impedance element.

21. A multizone induction heating system as described in claim 8 wherein at least one of said simultaneously emitted output frequencies operates at other than a resonance frequency of one any of said zones.

22. A multizone induction heating system as described in claim 21 wherein said control system to control the power delivered to each of said zones further comprises variable tuning circuitry configured to alter the amount of inductive heating caused by at least one of said zones.

23. A multizone induction heating system as described in claim 22 wherein said variable tuning circuitry comprises multiple frequency circuitry.

24. A multizone induction heating system as described in claim 22 wherein said variable tuning circuitry comprises resonance frequency variation circuitry.

25. A multizone induction heating system as described in claim 24 wherein said resonance frequency variation circuitry comprises at least one variable impedance element.

26. A multizone induction heating system as described in claim 8 wherein said control system to control the power delivered to each of said zones further comprises variable tuning circuitry configured to alter the amount of inductive heating caused by at least one of said zones.

27. A multizone induction heating system as described in claim 26 wherein said variable tuning circuitry comprises multiple frequency circuitry.

28. A multizone induction heating system as described in claim 26 wherein said variable tuning circuitry comprises resonance frequency variation circuitry.

29. A multizone induction heating system as described in claim 28 wherein said resonance frequency variation circuitry comprises at least one variable impedance element.

30. A multizone induction heating system comprising:
   a. a coil system divided into a plurality of zones, at least two of said zones having an electrical resonance frequency, said resonance frequencies having at least two different values;
   b. at least one power supply having at least one output frequency; and
   c. a control system to control the power delivered to each of said zones comprising unswitched resonant circuitry which establishes the resonance frequency of each of said zones and which establishes differentiated amounts of inductive heating by said zones.

31. A multizone induction heating system as described in claim 30 wherein said coil system comprises a plurality of coils.

32. A multizone induction heating system as described in claim 30 wherein said coil system comprises at least one coil divided into a plurality of sections.

33. A multizone induction heating system as described in claim 30 wherein said output frequency operates at about the resonance frequency of one of said plurality of zones of said coil system.

34. A multizone induction heating system as described in claim 33 wherein said control system to control the power delivered to each of said zones further comprises variable tuning circuitry configured to alter the amount of inductive heating caused by at least one of said zones.

35. A multizone induction heating system as described in claim 34 wherein said unswitched resonant circuitry which establishes the resonance frequency of each of said zones comprises:
   a. a first group of unswitched resonant circuitry which establishes resonance frequencies of a first group of zones; and
   b. a second group of unswitched resonant circuitry which establishes resonance frequencies of a second group of zones;
   and wherein said control system further comprises switching circuitry which is configured to selectively provide power to each of said groups of unswitched resonant circuitries.

36. A multizone induction heating system as described in claim 34 wherein said variable tuning circuitry comprises frequency switching circuitry.

37. A multizone induction heating system as described in claim 34 wherein said variable tuning circuitry comprises multiple frequency circuitry.

38. A multizone induction heating system as described in claim 33 wherein said unswitched resonant circuitry which establishes the resonance frequency of each of said zones comprises:
   a. a first group of unswitched resonant circuitry which establishes resonance frequencies of a first group of zones; and
   b. a second group of unswitched resonant circuitry which establishes resonance frequencies of a second group of zones;
   and wherein said control system further comprises switching circuitry which is configured to selectively provide power to each of said groups of unswitched resonant circuitries.

39. A multizone induction heating system as described in claim 34 wherein said variable tuning circuitry comprises resonance frequency variation circuitry.

40. A multizone induction heating system as described in claim 39 wherein said resonance frequency variation circuitry comprises at least one variable impedance element.

41. A multizone induction heating system as described in claim 30 wherein said control system to control the power delivered to each of said zones further comprises variable tuning circuitry configured to alter the amount of inductive heating caused by at least one of said zones.

42. A multizone induction heating system as described in claim 41 wherein said variable tuning circuitry comprises frequency switching circuitry.

43. A multizone induction heating system as described in claim 41 wherein said unswitched resonant circuitry which establishes the resonance frequency of each of said zones comprises:
   a. a first group of unswitched resonant circuitry which establishes resonance frequencies of a first group of zones; and
   b. a second group of unswitched resonant circuitry which establishes resonance frequencies of a second group of zones;
   and wherein said control system further comprises switching circuitry which is configured to selectively provide power to each of said groups of unswitched resonant circuitries.

44. A multizone induction heating system as described in claim 41 wherein said variable tuning circuitry comprises multiple frequency circuitry.

45. A multizone induction heating system as described in claim 41 wherein said variable tuning circuitry comprises resonance frequency variation circuitry.

46. A multizone induction heating system as described in claim 45 wherein said resonance frequency variation circuitry comprises at least one variable impedance element.

47. A multizone induction heating system as described in claim 30 wherein said unswitched resonant circuitry which establishes the resonance frequency of each of said zones comprises:
   a. a first group of unswitched resonant circuitry which establishes resonance frequencies of a first group of zones; and
   b. a second group of unswitched resonant circuitry which establishes resonance frequencies of a second group of zones;
   and wherein said control system further comprises switching circuitry which is configured to selectively provide power to each of said groups of unswitched resonant circuitries.

48. A multizone induction heating system as described in claim 30 wherein said unswitched resonant circuitry comprises unswitched resonance frequency circuitry which primarily affects one of said zones.

* * * * *